United States Patent
Kuo et al.

(10) Patent No.: US 8,391,069 B2
(45) Date of Patent: Mar. 5, 2013

(54) PROGRAMMING METHOD FOR NONVOLATILE SEMICONDUCTOR MEMORY DEVICE

(75) Inventors: Chung Shan Kuo, Hsinchu (TW); Zi Qiang Ku, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 180 days.

(21) Appl. No.: 13/105,539

(22) Filed: May 11, 2011

(65) Prior Publication Data
US 2012/0287721 A1    Nov. 15, 2012

(51) Int. Cl.
*G11C 11/34* (2006.01)
*G11C 16/04* (2006.01)

(52) U.S. Cl. ......... 365/185.18; 365/185.11; 365/185.17; 365/185.22

(58) Field of Classification Search ............ 365/185.18, 365/185.33, 230.06, 230.03
See application file for complete search history.

(56) References Cited

U.S. PATENT DOCUMENTS

| | | | |
|---|---|---|---|
| 6,212,101 B1 * | 4/2001 | Lee | 365/185.17 |
| 6,661,730 B1 * | 12/2003 | Scheuerlein et al. | 365/230.03 |

* cited by examiner

*Primary Examiner* — Alexander H Taningco
*Assistant Examiner* — Uyen B Tran
(74) *Attorney, Agent, or Firm* — Stites & Harbison, PLLC; Juan Carlos A. Marquez, Esq

(57) ABSTRACT

A method for programming a plurality of memory cells of a nonvolatile semiconductor memory device comprises the steps of: sequentially performing a plurality of divide-by-2 operations on the plurality of memory cells; generating a plurality of reduced groups from the memory cells after each of the divide-by-2 operations is performed; sequentially programming the memory cells of each reduced group; generating a final group after a final divide-by-2 operation is performed; programming the memory cells of the final group; and verifying whether the memory cells of the final group are completely programmed. The memory cells of the final group are composed of all the memory cells of the nonvolatile semiconductor memory device and the verifying step is only performed after the step of programming the memory cells of the final group.

8 Claims, 6 Drawing Sheets

PROGRAMMING METHOD FOR NONVOLATILE SEMICONDUCTOR MEMORY DEVICE

BACKGROUND OF THE INVENTION

1. Field of the Invention

The present invention relates to a method for programming a plurality of memory cells of a nonvolatile semiconductor memory device.

2. Description of the Related Art

Semiconductor memory devices are devices in which data can be stored and from which stored data can be retrieved. Semiconductor memory devices can be classified into volatile memory and nonvolatile memory. The volatile memory needs a power supply to retain data while the nonvolatile memory can retain data even when power is removed. Therefore, the nonvolatile memory devices have been widely used in applications in which power can be interrupted suddenly.

The nonvolatile memory devices comprise electrically erasable and programmable ROM cells, known as flash EEPROM cells. FIG. 1 shows a vertical cross-section of a flash EEPROM cell 10. Referring to FIG. 1, an N-type source region 13 and an N-type drain region 14 are formed on a P-type substrate or a bulk region 12. A p-type channel region is formed between the source region 13 and the drain region 14. A floating gate 16, which is insulated by an insulating layer 15, is formed on the P-type channel region. A control gate 18, which is insulated by another insulating layer 17, is formed on the floating gate 16.

FIG. 2 shows threshold voltages of the flash EEPROM cell 10 during program and erase operations. Referring to FIG. 2, the flash EEPROM cell 10 has a higher threshold voltage range (about 6 to 7V) during the program operation, and has a lower threshold voltage range (about 1 to 3V) during the erase operation.

Referring to FIGS. 1 and 2, during the program operation, hot electrons need to be injected from the channel region adjacent to the drain region 14 to the floating gate electrode, so that the threshold voltage of the EEPROM cell increases. In contrast, during the erase operation, the hot electrons injected into the floating gate 16 during the program operation need to be removed, so that the threshold voltage of the EEPROM cell decreases. Therefore, the threshold voltages of the EEPROM cell are varied after the program and erase operation.

One prior art method for programming an EEPROM cell is to apply a high voltage to the drain of the EEPROM cell transistor. For example, if the number of EEPROM cell transistors to be programmed is eight, a high voltage will be applied to the drain of each EEPROM cell transistor at one time in sequence. Therefore, the high voltage will be applied to the entire EEPROM cell transistors eight times. After the program operation has been performed on all eight EEPROM cell transistors, a verify operation is performed to check whether all the EEPROM cells are completely programmed. If all the memory cells are completely programmed, the programming of the memory cells is finished and further program operation is not performed. In contrast, if any one of the memory cells fails to be programmed, a second programming of the memory cells is performed. In the second programming, the high voltage is applied to the drain of each EEPROM cell transistor at one time in sequence. After the high voltage is applied to the entire EEPROM cell transistors eight times, the verify operation is repeated. The program and verify operations will be repeated until all the threshold voltages of the EEPROM cell transistors to be programmed reach a preset value (for example, 6V).

As described above, in the conventional program operation, the time required for the entire program operation increases in proportion to the number of programming steps to be repeated. In addition, a verify operation is required after each program operation for checking whether the current threshold voltages of the memory cell transistors to be programmed have reached a preset value. Therefore, the duration of the entire program is further increased by inserting multiple verify operation steps. Also, the memory device requires more complex circuits to perform the verify operation. In order to solve the foregoing problems, there is a need to provide an improved programming method.

SUMMARY OF THE INVENTION

An aspect of the present invention is to provide a method for programming a plurality of memory cells of a nonvolatile semiconductor memory device.

According to one embodiment of the present invention, the method comprises the steps of: sequentially performing a plurality of divide-by-2 operations on the plurality of memory cells; generating a plurality of gradually reduced groups from the memory cells after each of the divide-by-2 operations is performed; sequentially programming the memory cells of each reduced group; generating a final group after a final divide-by-2 operation is performed; programming the memory cells of the final group; and verifying whether the memory cells of the final group are completely programmed. The memory cells of the final group are composed of all the memory cells of the nonvolatile semiconductor memory device and the verifying step is only performed after all the programming the memory cells of the final group.

BRIEF DESCRIPTION OF THE DRAWINGS

The invention will be described according to the appended drawings in which.

DETAILED DESCRIPTION OF THE INVENTION

Figure 1:
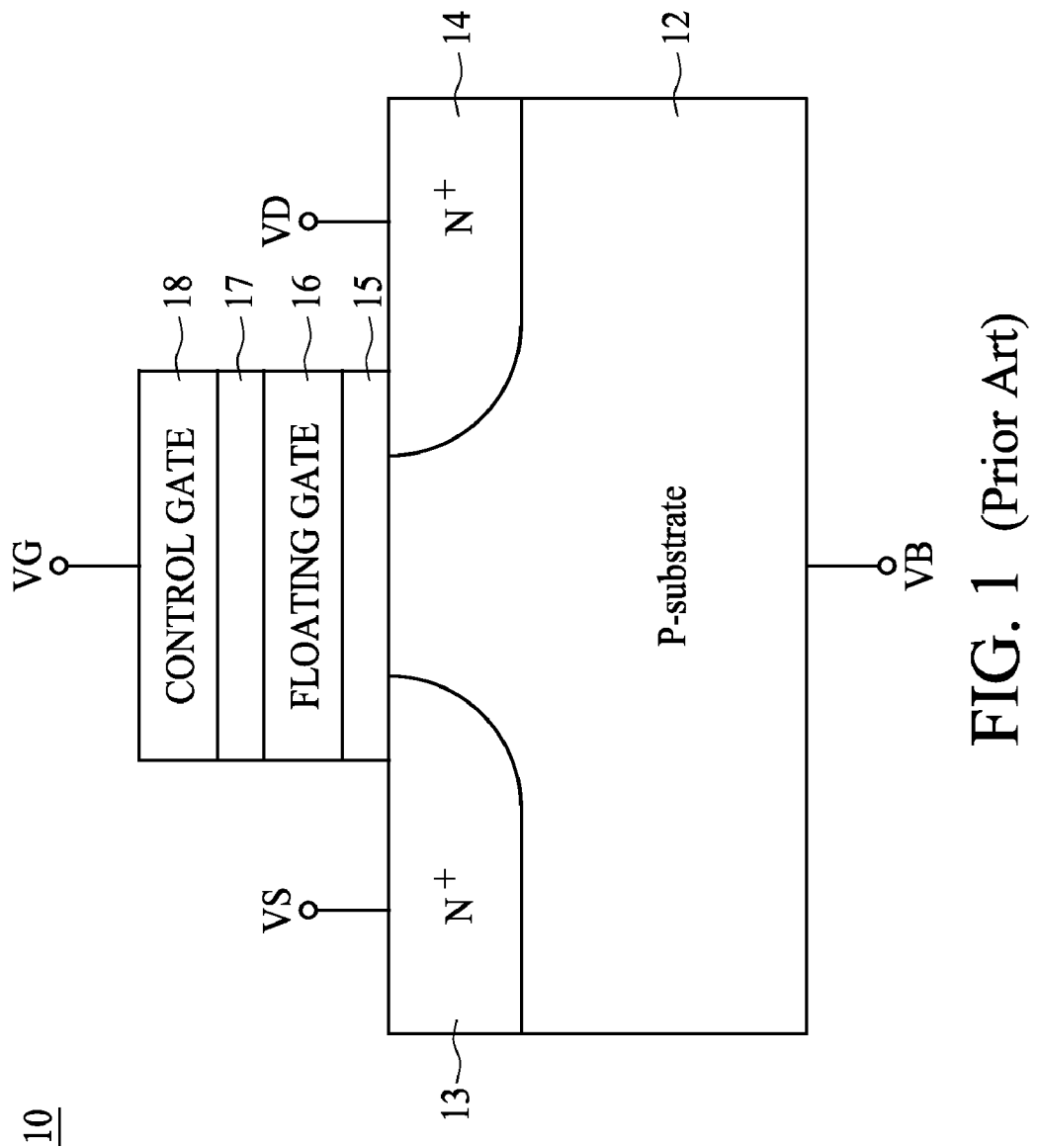
FIG. 1 shows a vertical cross-section of a flash EEPROM cell.
Figure 2:
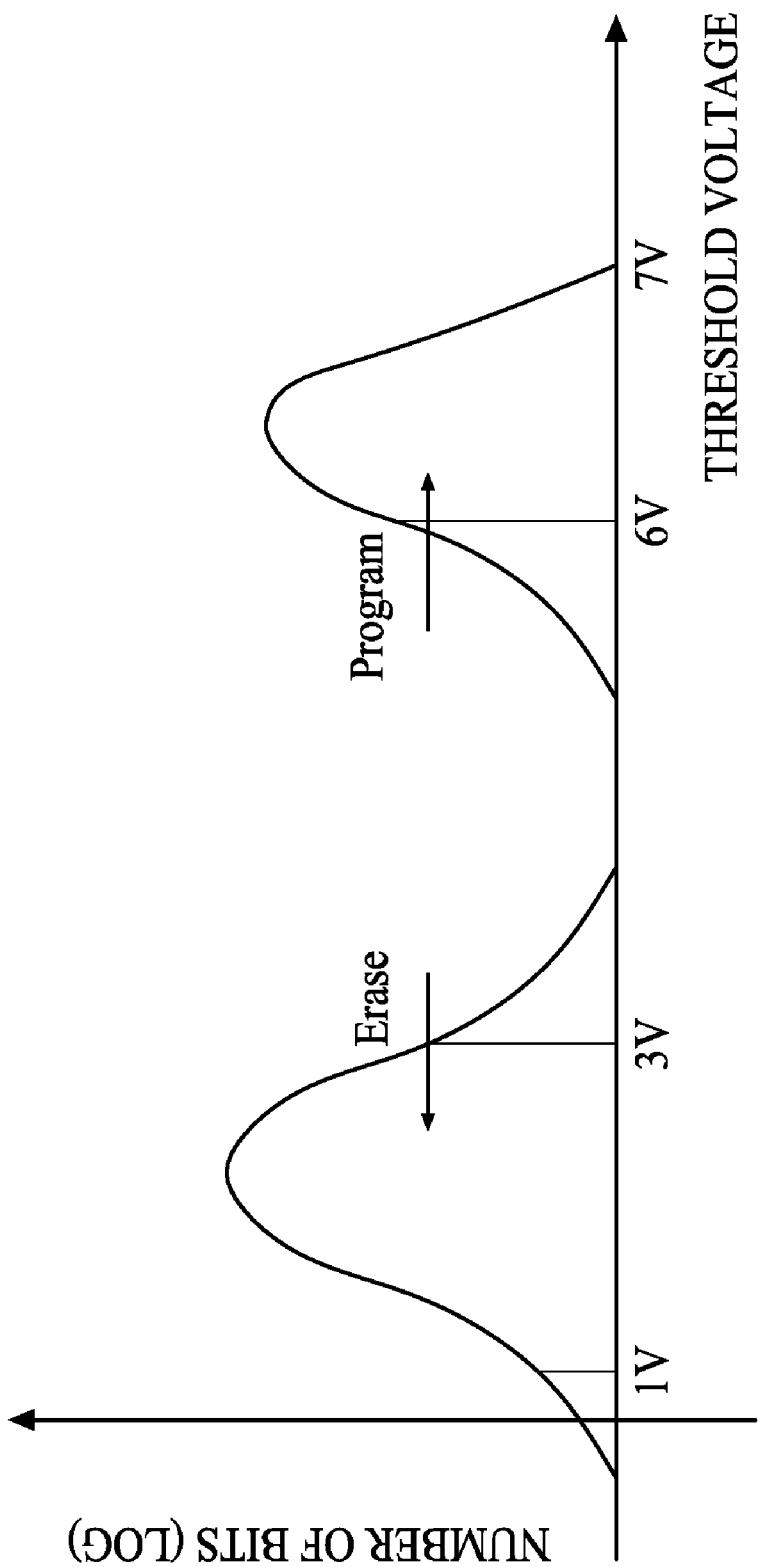
FIG. 2 shows threshold voltages of the flash EEPROM cell during program and erase operations.
Figure 3:
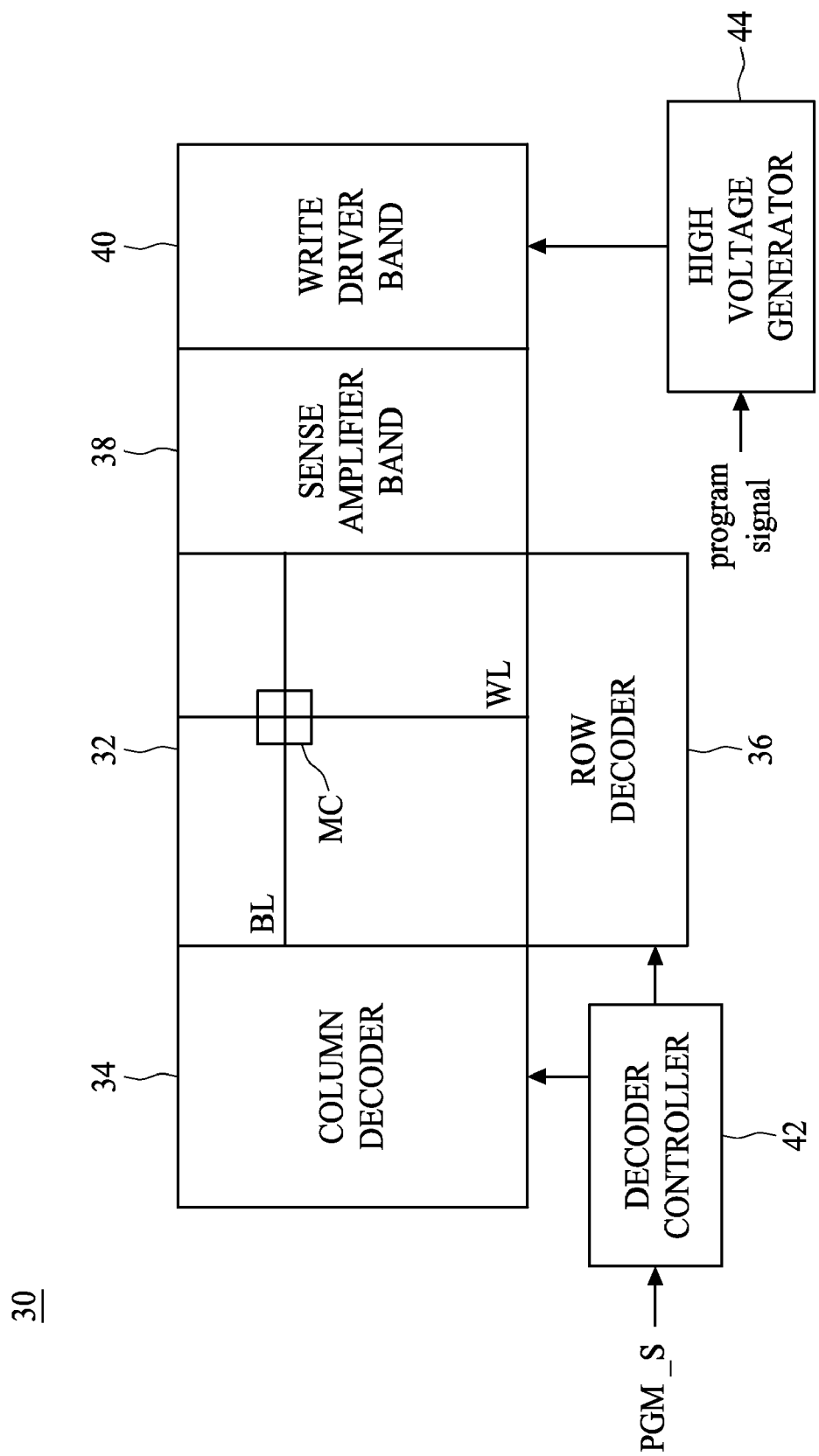
FIG. 3 shows a block diagram of a nonvolatile semiconductor memory device 30 according to one embodiment of the present invention.

In order to explain the method for programming a plurality of memory cells of a nonvolatile semiconductor memory device of the present invention, the nonvolatile semiconductor memory device that performs the method of the present invention will be described herein. FIG. 3 shows a block diagram of a nonvolatile semiconductor memory device 30 according to one embodiment of the present invention. Referring to FIG. 3, the memory device 30 includes a memory cell array 32 including a plurality of memory cells MC arranged in rows and columns. In one embodiment of the present invention, the nonvolatile semiconductor memory device 30 is a NOR type flash EEPROM device, and a plurality of NOR type memory cells form the entire memory cell array 32.

Referring to FIG. 3, the word lines WL connect first terminals of the memory cells MC arranged in the same row, and the bit lines BL connect second terminals of the memory cells MC arranged in the same column. A row decoder 36 connects to the memory cell array 32 to provide word line voltages to the memory cell array 32, and a column decoder 34 connects to the memory cell array 32 to provide bit line voltages to the memory cell array 32. A sense amplifier band 38 includes a plurality of sense amplifiers for detecting and amplifying data in the memory cells MC connected to the selected rows in the memory cell array 32. A write driver band 40 includes a plurality of write drivers for writing data into the selected memory cells in the memory cell array 32. A high voltage generator 44 generates a high voltage required for programming of memory cells in response to program signals and applies the voltage to the sense amplifier band 38 and the write driver band 40.

Figure 4:
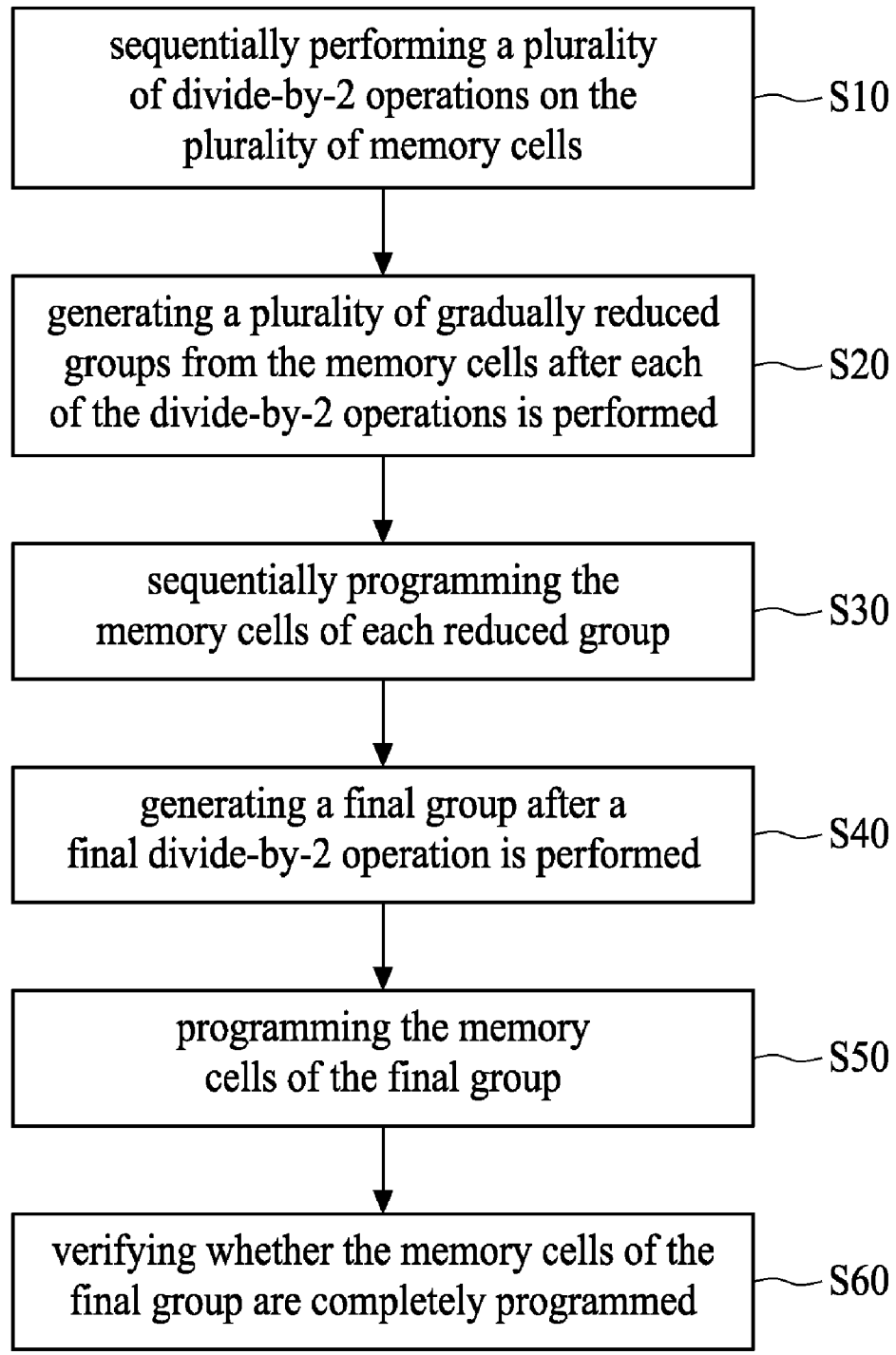
FIG. 4 shows the flow chart of one embodiment of the method for programming a plurality of memory cells of a nonvolatile semiconductor memory device of the present invention.

FIG. 4 shows the flow chart of one embodiment of the method for programming a plurality of memory cells of a nonvolatile semiconductor memory device of the present invention, which comprises sequentially performing a plurality of divide-by-2 operations on the plurality of memory cells (S10), generating a plurality of gradually reduced groups from the memory cells after each of the divide-by-2 operations is performed (S20), sequentially programming the memory cells of each reduced group (S30), generating a final group after a final divide-by-2 operation is performed (S40), programming the memory cells of the final group (S50), and verifying whether the memory cells of the final group are completely programmed (S60). The following describes the details of the programming method of the present invention.

Figure 5:
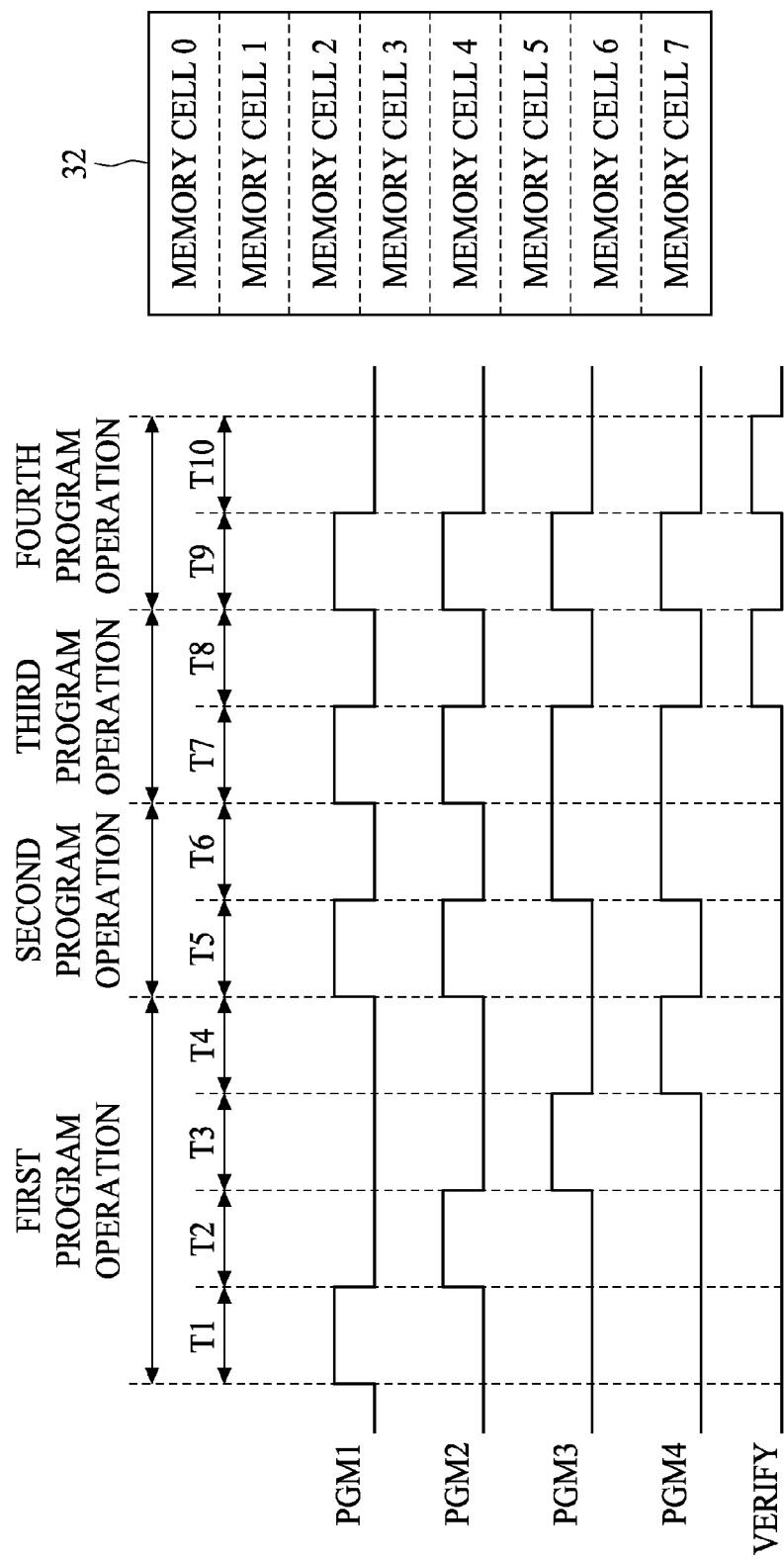
FIG. 5 is a timing diagram showing the performing of the program operations according to one embodiment of the present invention.

Referring to FIG. 3, after receiving a program commend PGM_S, the memory device 30 enters a program mode, and a decoder controller 42 generates decoded signals to the column decoder 34 and the row decoder 36 to determine which memory cells are to be programmed in the memory cell array 32 at different times. FIG. 5 is a timing diagram showing the performing of the program operations according to one embodiment of the present invention. In this embodiment, the total number of memory cells to be programmed is set to 8. Referring to FIG. 5, program signal PGM1 has a logic high level during time interval T1, program signal PGM2 has a logic high level during time interval T2, program signal PGM3 has a logic high level during time interval T3, and program signal PGM4 has a logic high level during time interval T4 at a first program operation.

The program signals PGM1 to PWM4 are signals indicating which memory cells are programmed together at one time. In other words, when one of the signals PGM1 to PWM4 transitions from a logic low level to a logic high level, the memory cells corresponding to signals PGM1 to PGM4 are programmed at one time. In one embodiment of the present invention, the memory cells 0 to 7 are divided into four groups, and the program operation is performed four times, once per group, in the first program operation. For example, the memory cells 0 and 4 corresponding to signal PGM1 belong to the first group and are programmed at one time during time interval T1, the memory cells 1 and 5 corresponding to signal PGM2 belong to the second group and are programmed at one time during time interval T2, the memory cells 2 and 6 corresponding to signal PGM3 belong to the third group and are programmed at one time during time interval T3, and the memory cells 3 and 8 corresponding to signal PGM4 belong to the fourth group and are programmed at one time during time interval T4 in the first program operation.

After the first program operation, memory cells 0 to 7 are divided into two groups, and the programming is performed two times, once per group, at a second program operation. Referring to FIG. 5, signals PGM1 and PGM2 transition from a logic low level to a logic high level during time interval T5 and signals PGM3 and PGM4 transition from a logic low level to a logic high level during time interval T6 in the second program operation. Therefore, the memory cells 0, 1, 4, and 5 corresponding to signals PGM1 and PGM2 belong to the first group and are programmed at one time during time interval T5, and the memory cells 2, 3, 6, and 8 corresponding to signals PGM3 and PGM 4 belong to the second group and are programmed at one time during time interval T6 in the second program operation.

After the second program operation, memory cells 0 to 7 are classified into only one group, and the programming is performed at one time in a third program operation. Referring to FIG. 5, signals PGM1 to PGM4 have a logic high level during time interval T7 in the third program operation. Therefore, all the memory cells 0 to 7 are programmed at one time during time interval T7 in the third program operation. After the third program operation, a verify operation is performed to check whether all the memory cells are completely programmed. Referring to FIG. 5, a signal VERIFY has a logic high level during time interval T8. Therefore, a program checking operation is performed during time interval T8 in the third program operation.

Figure 6:
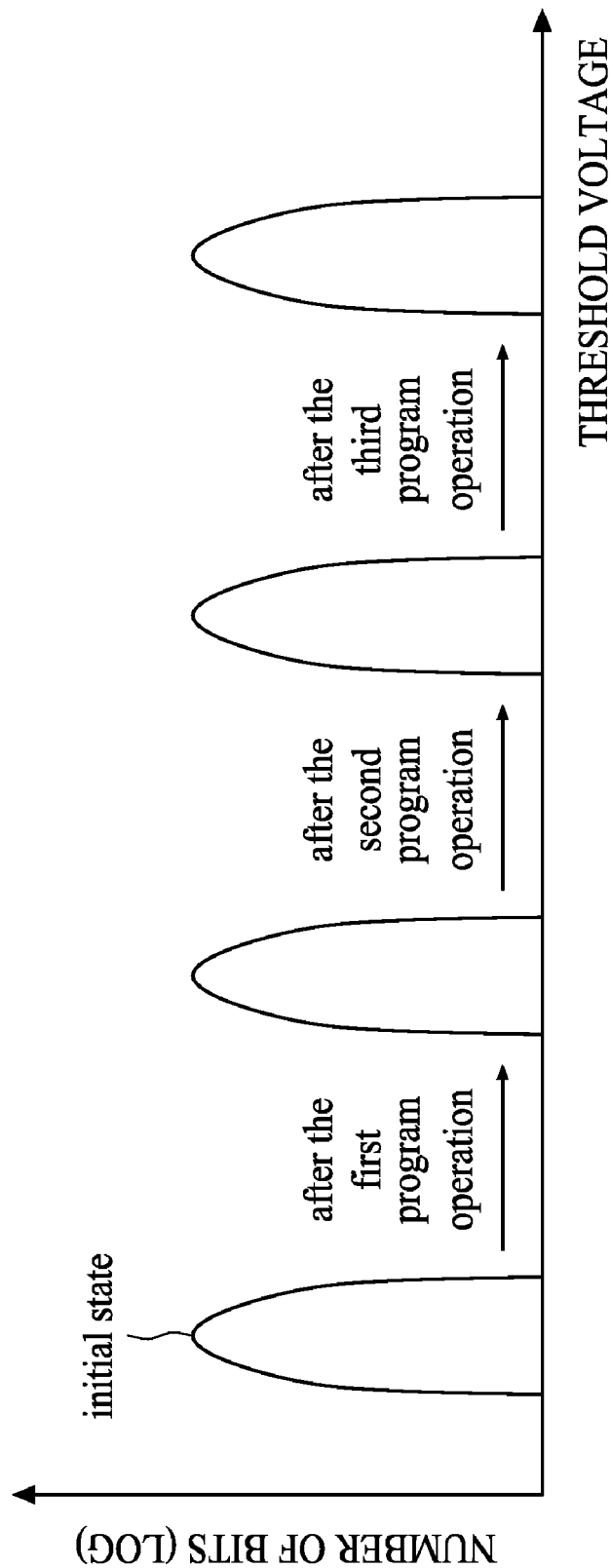
FIG. 6 is a timing diagram showing the variation of the threshold voltage of the memory cells after multiple program operations are performed.

The program operation is performed as described below. Referring to FIG. 3, the high voltage generator 44 connects to the write drivers 40. The high voltage generator 44 generates a high voltage required for programming of memory cells in response to the program signals PGM1 to PGM4 and applies the voltage to the write driver 40. In one embodiment of the present invention, the write driver 40 applies the high voltage to the drain of the selected memory cell transistor to increase the threshold voltages of the selected memory cell transistors during the program operation. Therefore, the threshold voltages of the memory cells 0 to 7 are increased in the first program operation, and are further increased in the second and third program operations as shown in FIG. 6. The increasing amplitude of the threshold voltages of the memory cells 0 to 7 can be adjusted by varying the programming time, such as time intervals T1 to T7, of the memory cells, or by varying the programming voltage applied to the memory cells.

Referring to FIG. 5, the verify operation is repeated if any one of the memory cells fails to be programmed. The verify operation can be performed by comparing a threshold voltage of each programmed memory cell with a preset voltage. If the threshold voltage of any one of the programmed memory cells does not reach the preset voltage, a reprogramming of all the memory cells 0 to 7 is performed. Therefore, if all the threshold voltages of the programmed memory cells reach the preset voltage, the verify operation is not performed and the program is completed.

Compared to the conventional program operation, the time for the entire program in the present invention is significantly reduced because the number of memory cells to be programmed at one time in the second program operation is divided by 2, and is reduced further in the subsequent program operations. Furthermore, the verify operation is only performed after all the memory cells are classify into one group and are programmed at one time in the present invention. Therefore, the entire program time can be reduced and the circuitry of the memory device can be simplified in the present operation.

The above-described embodiments of the present invention are intended to be illustrative only. Numerous alternative embodiments may be devised by those skilled in the art without departing from the scope of the following claims.

What is claimed is:

1. A method for programming a plurality of memory cells of a nonvolatile semiconductor memory device, the method comprising the steps of:
    sequentially performing a plurality of divide-by-2 operations on the plurality of memory cells;
    generating a plurality of gradually reduced groups from the memory cells after each of the divide-by-2 operations is performed;
    sequentially programming the memory cells of each reduced group;
    generating a final group after a final divide-by-2 operation is performed;
    programming the memory cells of the final group; and
    verifying whether the memory cells of the final group are completely programmed;
    wherein the memory cells of the final group are composed of all the memory cells of the nonvolatile semiconductor memory device and the verifying step is only performed after the step of programming the memory cells of the final group.

2. The method of claim 1, wherein the step of sequentially performing the plurality of divide-by-2 operations on the plurality of memory cells comprises:
    dividing m memory cells into n groups, wherein m and n are positive integers;
    reducing the number of the n groups by half by merging memory cells in different groups; and
    repeating the reducing step.

3. The method of claim 1, wherein the nonvolatile semiconductor memory device is a NOR type flash EEPROM device.

4. The method of claim 1, further comprising programming the memory cells of the final group again if any memory cell of the final group fails in the programming operation.

5. The method of claim 1, wherein the verifying step is performed by comparing a threshold voltage of each programmed memory cell with a preset voltage.

6. The method of claim 1, wherein the programming step is performed by raising threshold voltages of the memory cells.

7. The method of claim 5, wherein the threshold voltages of the memory cells are controlled by applying different programming time interval to the memory cells.

8. The method of claim 5, wherein the threshold voltages of the memory cells are controlled by applying different voltages to the memory cells.

\* \* \* \* \*